United States Patent [19]

Erdogan et al.

[11] Patent Number: 5,721,636
[45] Date of Patent: Feb. 24, 1998

[54] LASER PUMPING OF ERBIUM AMPLIFIER

[75] Inventors: Turan Erdogan, Berkeley Heights; Clinton Randy Giles, Middletown; Victor Mizrahi, Bedminster, all of N.J.

[73] Assignee: Lucent Technologies Inc., Murray Hill, N.J.

[21] Appl. No.: 721,639

[22] Filed: Sep. 26, 1996

Related U.S. Application Data

[63] Continuation of Ser. No. 178,142, Jan. 6, 1994, Pat. No. 5,563,732.

[51] Int. Cl.[6] .................................. H01S 3/30; G02B 6/26
[52] U.S. Cl. .................................. 359/341; 385/37; 372/97
[58] Field of Search ........................... 359/134, 160, 359/337, 341, 345; 385/1, 37; 372/20, 32, 33, 97

[56] References Cited

U.S. PATENT DOCUMENTS 5,563,732 10/1996 Erdogen et al. .................. 359/341

Primary Examiner—Nelson Moskowitz
Attorney, Agent, or Firm—Michael J. Urbano; Lester H. Birnbaum

[57] ABSTRACT

Stability of a pump laser for activating an erbium amplifier is enhanced by a grating which results in laser operation in the coherence collapse regime.

9 Claims, 3 Drawing Sheets

LASER PUMPING OF ERBIUM AMPLIFIER

CROSS-REFERENCE TO RELATED APPLICATION

This application is a continuation of application Ser. No. 08/178142 filed on Jan. 6, 1994 now U.S. Pat. No. 5,563,732 (Erdogan-Giles-Mizrahi 4-18-19).

BACKGROUND OF THE INVENTION

1. Technical Field

The field addressed is that of optical fiber communication entailing optical amplification. It specifically concerns optical pumping of an erbium fiber amplifier for single channel or multiple channel (wavelength division multiplex) use.

2. Description of the Prior Art

Most advanced optical fiber communication systems now in place and contemplated owe success and operating characteristics to the erbium-doped fiber amplifier ("EDFA"). Due to its low noise figure, it becomes practical to increase span lengths between regenerators to suit most terrestrial and underwater needs. The gain bandwidth of this excellent amplifier is sufficient to permit simultaneous amplification of multiple channels and, for this reason lends impetus to wavelength division multiplexing (WDM).

EDFA's are commonly pumped at about 1480 nm—the emission wavelength of a commercially available laser. While acceptable, there are advantages to be realized by pumping the amplifier with a source matched to the 980 nm erbium absorption line. For one thing, amplifier noise is inherently lowered. A further advantage is realized for WDM systems of the future. The gain spectrum of the amplifier over the needed wavelength region to encompass the separate channels is substantially wavelength-independent.

The InGaAs strained quantum well laser has been identified as a suitable 980 nm pump source for the erbium amplifier. In addition to satisfying contemplated advantages for amplifier operation, its improved electrical-to-optical conversion efficiency at this wavelength results in a power saving and reduced heating. See, S. Uehara, "Pump sources for erbium doped fiber amplifiers", *Technical Digest on Optical Amplifiers and Their Applications*, 1990 (Optical Soc. of America) vol. 13, Paper WA1, pp. 206–209.

Operation at this pump wavelength, however, raises a new problem. Pump wavelength stabilization at 1480 nm has been assured by use of an optical isolator. Corresponding 980 nm devices are relatively lossy.

The problem is aggravated by a growing desire to provide for two or more tandem lasers for increased power and redundancy. Without an isolator laser interactions may cause fluctuations in power level.

SUMMARY OF THE INVENTION

A pump laser is stabilized against wavelength fluctuations due to spurious reflections from a device being pumped by use of a grating. The grating and laser, together, form a cavity in which the laser emission bandwidth is spectrally broadened to fill the bandwidth of the grating. Spectral broadening is due to operation in the "coherence collapse" regime—a mode of operation in which the laser line is broadened by satellite modes. The coherence collapse regime is, in a real sense, inconsistent with the usual purpose served by the laser. In both reducing coherence and increasing emission bandwidth, it becomes unsuitable for such purposes.

The arrangement is particularly useful in stabilization of a laser operating at a nominal emission wavelength of 980 nm, and pumping an erbium-doped fiber amplifier. Included operation provides for tandem as well as single-laser pumps and so offers increased power and enhanced reliability. Stabilization of tandem lasers is attainable with a single grating, or alternatively with individual grating-laser pairs. Stabilization of the 980 nm pump is advantageous for WDM operation in that the erbium amplifier spectrum is at near-constant power level over a wavelength range sufficient for contemplated channel carrier wavelengths.

Claims are directed to system operation as well as to a stabilized pump laser, sometimes in combination with an amplifier.

Another aspect of the invention relates to a multiple pump laser scheme in which the grating-laser pairs form at least partially overlapping cavities (i.e., resonators). A coupler combines the laser outputs which are used to pump one or more fiber amplifiers.

DETAILED DESCRIPTION

1. General

The invention is primarily directed to stabilized 980 nm pump operation for an erbium amplifier. Availability of a strained quantum well laser in the indium gallium arsenide III-V system operating at this wavelength, offers promise for various advantages over 1480 nm pumping. In lieu of wavelength stabilization by use of a Faraday rotation isolator, use is made of a fiber interference grating (a "pigtail grating") operating in a hitherto undesired regime-that of coherence collapse.

Practical unavailability of an isolator leaves unstabilizing effects due to spurious reflections from the amplifier. Pigtail stabilization for usual highly coherent laser operation does not accommodate these reflections. The concept is modification of the laser emission to yield a relatively broad and featureless band. This in turn reduces the statistical likelihood of mode locking on a specific reflection. Tandem laser arrays, preferable both for their higher power output and for improved reliability due to redundancy, are effectively stabilized for the same reason. Whether or not provided with individual pigtails, the injection locking of two or more lasers of the array is made statistically improbable.

The coherence collapse regime, in calling for reduced coherence as well as emission spectral broadening, has been considered an undesirable state. Reference to the regime in the literature, together with conditions necessary for its attainment, has been directed to its proscription. These conditions are sufficient to assure its attainment for serving the inventive purposes. Representative literature is cited and requirements are outlined under "Coherence Collapse Regime". A literature reference describing grating design is cited and discussed under "Grating Design".

As noted earlier, the grating forms a cavity (i.e., a resonator) with each pump laser, and as shown in the Figures discussed below, the resonators are at least partially overlapping. This arrangement, combined with a suitable intracavity coupler, allows the outputs of the pump lasers to be combined. The combined output is delivered to one or more fiber amplifiers located external to the resonators.

2. Figure Description

Figure 1:
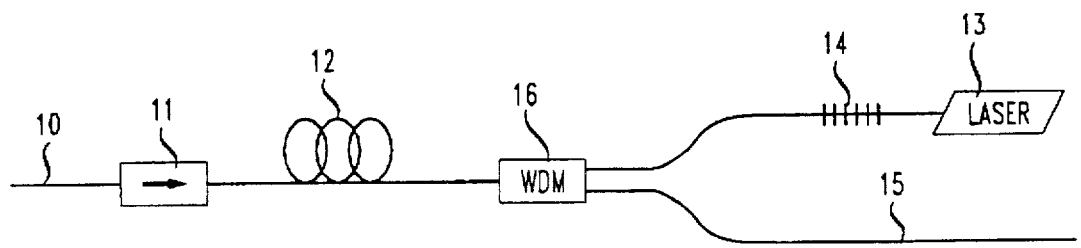
FIG. 1 is a circuit diagram of an optical fiber communication system incorporating an amplifier pumped by a grating-stabilized laser.

FIG. 1 is illustrative. It provides for an incoming signal on fiber 10 which is the terminal portion of the span for which amplification is required. The incoming signal at a nominal carrier wavelength of 1550 nm may be single channel or WDM. The signal next passes through isolator 11 which prevents transmission of back reflections from the amplifier. Erbium amplifier 12 amplifies single or multiple channels presented. Pump source including laser 13 and pigtail grating 14 provide pump energy at a nominal wavelength of 980 nm to amplifier 12 to result in amplified signal on fiber 15. Element 16, often described as a "WDM" device serves to separate pump and signal wavelengths as shown. (Henceforth in this description, the designation "WDM" is reserved for multi-channel operation. Elements serving this function will be referred to as "Signal/Pump Routers".)

FIG. 1 is intended to be representative of WDM systems as well, so that the "signal" introduced on fiber 10 may include multiple channels. WDM systems are not discussed in detail in this specification. Typical channel separation is on the order of 10 GHz to 200 GHz which is sufficiently close spacing to permit simultaneous amplification.

Figure 2:
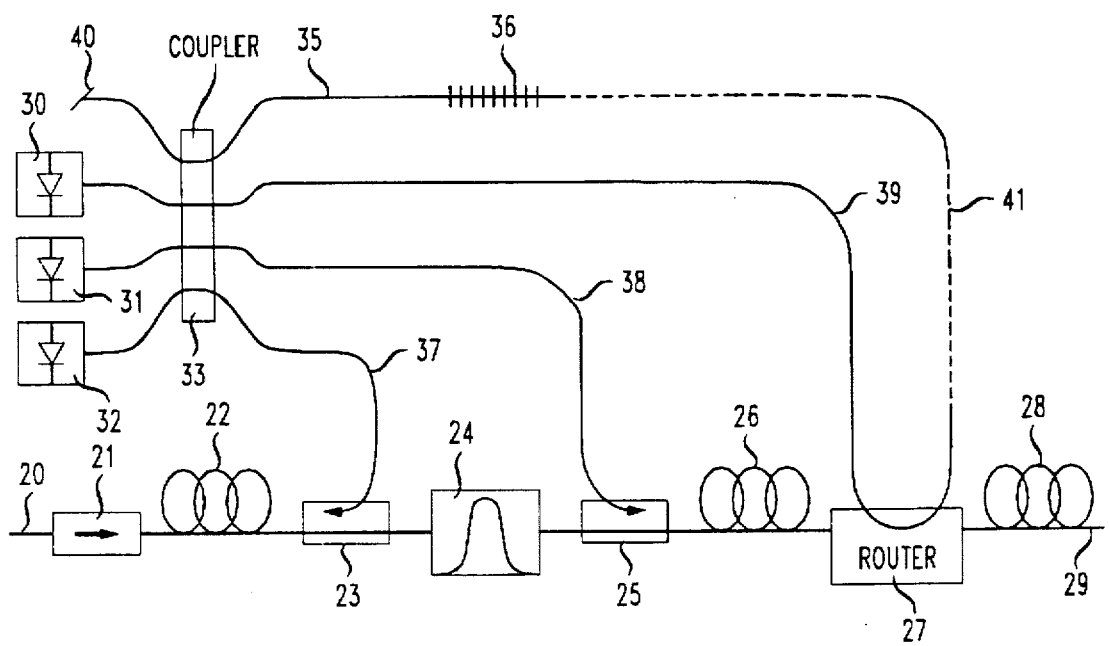
FIG. 2 is a similar diagram providing for stabilization of a tandem array of lasers.

FIG. 2 diagrams the tandem pump arrangement which was used experimentally. It shows an incoming signal introduced on input fiber 20 followed by isolator 21 and first erbium amplifier 22. Following circuit elements are: first pump/signal router 23, 2 nm band pass filter 24, second router 25, second amplifier 26, third router 27 and third amplifier 28. The arrangement is one form of multi-stage amplifier. The amplified signal is introduced into the following fiber span 29. Three tandem 980 nm lasers 30, 31 and 32 were coupled through a 4 by 4 coupler 33 with lines 35 to pigtail grating 36 and lines 37, 38, and 39 to amplifiers 22, 26, 28 and 28 via associated routers 23, 25 and 27. The experimental circuit used a commercially available 4×4 coupler, and so the fourth input port was terminated as shown at 40. A real system would likely include a fourth laser pump in lieu of the termination.

FIG. 2 also shows an arrangement for coupling multiple pump lasers (e.g., diode lasers 30, 31, 32) to one or more fiber gain sections (e.g., fiber amplifiers 22, 26, 28). As noted earlier, each pump laser 30, 31, 32 forms a cavity (i.e., resonator) with a fiber grating 36. In fact, the resonators of the laser-grating pairs at least partially overlap one another; that is, the portions of the resonators which share the coupler 33 overlap one another. Thus, the coupler 33 is at least partially an intracavity device. Coupler 33 couples the lasers 30, 31, 32 to the grating 36 and to the amplifiers 22, 26, 28. The latter, however, are located external to the laser-grating resonators.

Also shown in FIG. 2 is an illustrative arrangement by which the combined pump laser output on line 37 is delivered as a counter-propagating signal to amplifier 22, and as co-propagating signals to amplifiers 26 and 28.

Figure 3:
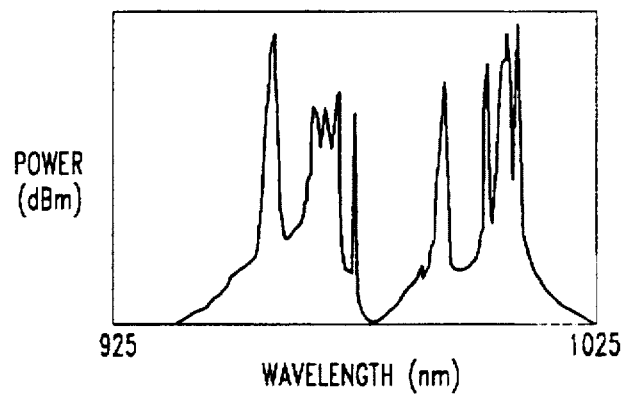
FIGS. 3 and 4 plot laser emission power as a function of wavelength for the experimental conditions of Example 2.
Figure 4:
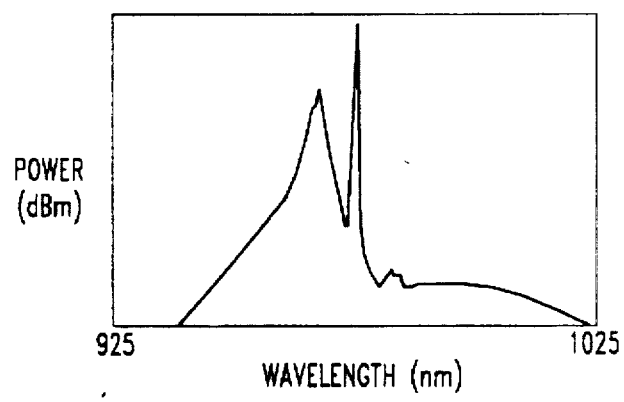

Broken line 41 represents an unwanted fiber, experimentally found to introduce instability, and so forbidden. FIGS. 3 and 4 show laser output as measured at termination 40 with fiber 41 (FIG. 3) and without (FIG. 4). In both instances, the ordinate is emission power in dB and the abscissa is wavelength in nm. The effect of the unwanted fiber connection is to provide an additional path to grating 36, in turn resulting in spreading of the pump emission spectrum to include a greater fraction of energy outside the absorption line of the erbium amplifiers.

The figures illustrate parts of the communication system modified by the invention. The remainder of the system may be conventional. Operating parameters such as power level, in turn dependent on span length, bit rates, fiber design, transmitter design etc. are well known and are described in that reference.

The remaining FIGS., 5 through 8, plot experimentally derived information and are discussed in conjunction with Examples 3 through 6, respectively, which relate to those experiments.

3. Coherence Collapse Regime

The mechanism of coherence collapse is the frequency chirping of the laser output resulting from intensity fluctuations. These intensity fluctuations are induced by instability in the coherent locked state of the laser internal field with the feedback field, driven by spontaneous emission. The coherence collapse regime occurs for reflector distances significantly greater than the laser cavity length and grating power reflectivities typically in the −30 to −5 dB levels. Line narrowing and stable locking may otherwise occur.

From the analysis of C. Henry and R. F. Karzarinov, ("Instability of semiconductor lasers due to optical feedback from distant reflectors", IEEE J. Quantum Electron. vol. QE-22, pp. 295–301, 1986), the onset of coherence collapse typically occurs for $R_o > 0.01 R/(1-R)^2$ where R and $R_o$ are the power reflectivities of the facet and external reflector, respectively. For a cleaved facet Fabry-Perot laser, R~0.35 and $R_o > -21$ dB may result in coherence collapse. For an anti-reflection coated-facet laser, such as likely to be used with the erbium amplifier, R~0.005, and $R_o > -43$ dB induces coherence collapse. see C. R. Giles, T. Erdogan, V. Mizrahi, "Simultaneous Wavelength-Stabilization of 980-nm Pump Lasers", in *Optical Amplifiers and Their Applications, Technical Digest*, 1993, vol. 14, (Optical Society of America, Wash., D.C. 1993), pp. PD11-1–PD11-4.

Although coherence collapse may assist in the operation of the pump laser by lowering the effects of spurious reflections, it also causes intensity fluctuations in the laser output. In pump lasers, this may have detrimental effects if the relative intensity fluctuations are large and are at frequencies below ~100 kHz. The modulation depth of the intensity fluctuations diminishes as the laser current increases. Close to threshold, the reflection effects may completely turn off the laser. This condition is avoided by operation at least 10% above threshold. The nominal period of the intensity fluctuations has been observed to be 10–20 times the round trip time between the laser and the grating. The characteristic frequency of the fluctuations is f~c/40 nL where f is the fluctuation frequency, c is the speed of light, n is the relevant refractive index (generally of the fiber), and L is laser-to-grating spacing. The required condition of L<50 m for f>100 kHz is easily met. The required conditions for coherence collapse are satisfied by a power reflectivity for the fiber grating (adjusted for laser-to-fiber coupling losses) −43 dB<$R_o$<−5 dB for a laser having a coated facet reflectivity R~0.5%, at a distance ~0.1 m<L<~10 m from the laser.

Coherence collapse is one of the five regimes of laser operation permitted for a laser-grating arrangement. See. R.

W. Tkach and A. R. Chraplyvy, "Regimes of Feedback Effects in 1.5 -um Distributed Feedback Lasers", *Journal of Lightwave Technology*, vol. LT-4, No. 11, pp. 1655–1661, November 1986. The coherence collapse state is described under "Regime IV" at p. 1655. The described laser line broadening to 50 GHz exceeds that required to fill the grating.

The coherence collapse regime differs from and is inappropriate for stabilization of transmitter lasers for lightwave communications, in which a highly coherent operation is required. Desired operating conditions for this purpose are described under "Regime V", beginning on p. 1655. The essence of the inventive teaching is that the frequency-broadened laser, corresponding with coherence collapse, is less affected by spurious reflections. Because of the inherently reduced coherence, likelihood of injection locking makes it suitable for stabilization of tandem arrays (FIG. 2). Standing-wave spatial holeburning and coherent mode-beating are unlikely to occur. It has been indicated that, while an entire array is effectively stabilized by a single pigtail, separate laser-pigtails may be used.

The coherence collapse regime is defined precisely. For the inventive purposes, it is required that the output of the "external cavity" (that made up of the laser together with the grating—the Fabry-Perot defined by the grating and the furthest reflector of the laser cavity) be of adequate bandwidth. Whereas acceptable laser operation for conventional purposes typically has an output bandwidth of less than 100 MHz broadening for the results reported has been to an output bandwidth of at least 1 GHz. (Both values are in conventional terms of width as measured 3 dB down from peak value.)

4. Grating Design

Discussion is largely in terms of the broadly used fiber grating. The function may be served by other structures, collectively described as waveguide gratings. For the particular use contemplated where line broadening is an objective, it may be useful to deviate from structures of equally-spaced lines. One such structure is known as a chirp grating.

Fiber gratings are well-known. Illustrative references are, G. Meltz, et al., "Formation of Bragg gratings in optical fibers by a transverse holographic method", *OPTICS LETTERS* vol. 14, No. 15, Aug. 1, 1989, pp. 823–825; W. W. Morey, et at., "Holographically generated gratings in optical fibers", *Optics and Photonics News*, Jul. 1990, pp. 14–16; "Fiber Bragg grating tunes laser diodes", *Laser Focus*, January 1993, pp. 20–21.

Fiber gratings are regularly made by interference of coherent beams illuminating germanium-doped silica fiber, with the grating being defined by light-induced defects. This effect has been enhanced, e.g. by use of hydrogen ambient which increases the defect intensity. Quantity manufacture is based on use of a phase mask of an interference grating, generally on a flat surface, which may or may not be formed by the same mechanism. The mask is then used as a master for replicating the grating in the fiber.

Reflectivity conditions to assure the coherence collapse regime have been described under "Coherence Collapse Regime". Alternative conditions to attain this known state may be determined and/or verified empirically.

It is well known that the pigtail grating serves as a distributed Bragg reflector with wavelength selectivity due to half wavelength spacing between grating lines. Adjusted for the refractive index for the germanium silicate pigtail, spacing was 0.3 µm–0.4 µm. The structures used in the examples had about 20,000 lines, and were approximately 7 mm in length.

Examples

Example 1

An InGaAs strained-QW laser was used in the arrangement of FIG. 1. While not shown in that figure, the laser was coupled through a fused fiber coupler, with one input port used to monitor reflections. The coupler had an average excess loss of 0.53 dB and less than 0.15 dB polarization sensitivity. The fiber grating depicted as element 14 in FIG. 1 was holographically produced and had a ~64% reflection at 975 nm with a reflection bandwidth of 0.08 nm. The laser was operated at 200 mA drive current and delivered fiber-coupled power of 65 mW as measured at the grating.

Figure 5:
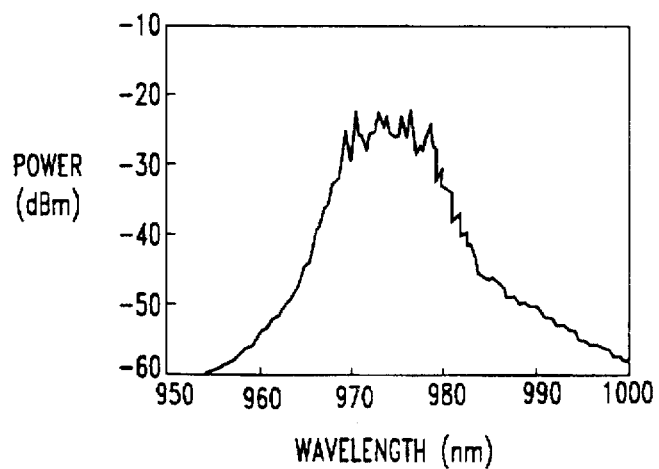
FIGS. 5 and 7 relate the same parameters, but for the experimentally derived information of Examples 3 and 4. Those examples did not provide for the grating-stabilization of the invention.

For comparison the initial experiment omitted the grating. The result, plotted on FIG. 5, exhibited strong mode partitioning over the wavelength range 965–980 nm. The time-averaged results plotted show significant instability as well as spectral width, outside the absorption spectrum of the amplifier.

Example 2

Figure 7:
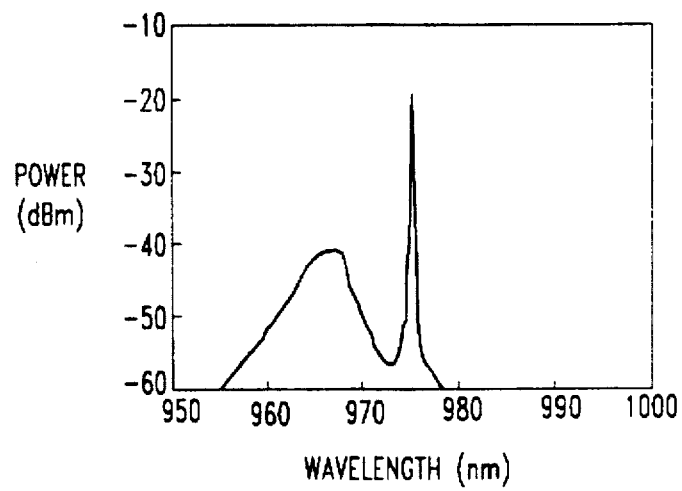

The experiment of Example 1 was repeated with the grating connected. Results plotted on FIG. 7 show laser-grating locking and stable emission over a band centered at a wavelength of 975 nm. Including fiber coupler and laser-to-fiber coupling losses, the net power reflectivity was approximately 1.3%. Coherence collapse under these conditions resulted in the desired spectral width broadening to fill the grating bandwidth (of ~10.5 GHz).

Examples 3

The apparatus of FIG. 2 was used and experimentally verified stabilization of a tandem array of three lasers with a single fiber grating. Fiber 41, shown in phantom, was omitted in both Examples 3 and 4 to avoid the experimentally observed instability shown in FIG. 3. The same fiber coupler was utilized for inputting 3 InGaAs QW lasers. A fourth input port was used to monitor reflections. Excess loss and polarization sensitivity were as reported in Example 2. Power in the four output ports at 980 nm was equal to within 0.23 dB.

Figure 6:
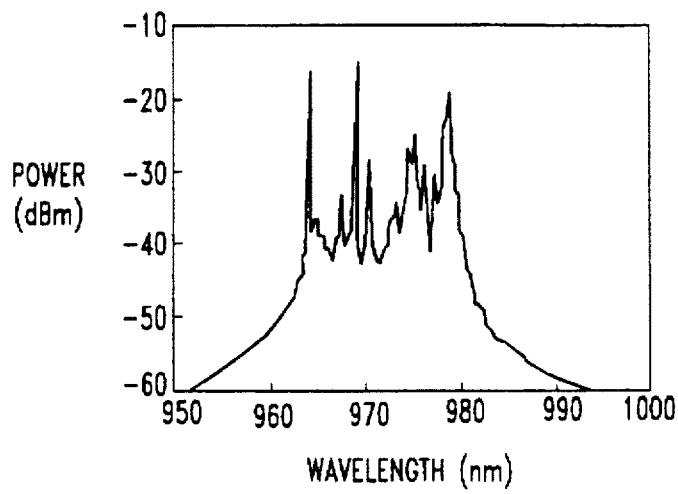
FIGS. 6 and 8 plot the same parameters under the identical conditions of FIGS. 5 and 7, but provide grating-stabilization. Corresponding examples are 5 and 6.

The output spectrum, for operation without the grating, is shown in FIG. 6.

Figure 8:
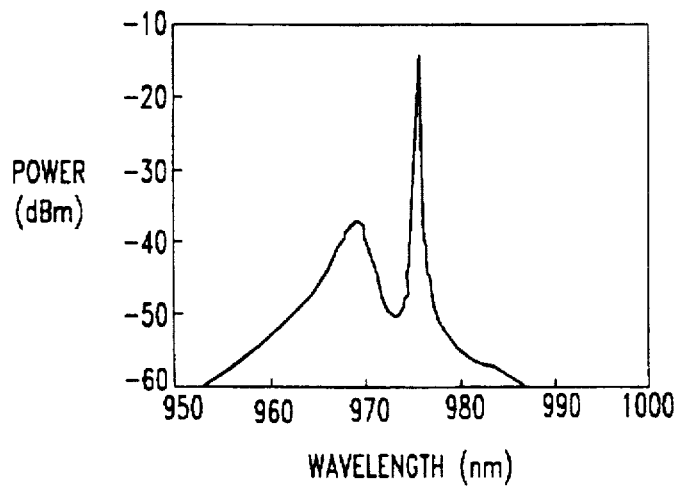

In Example 4, the experiment of Example 3 was repeated with the grating connected. The pump lasers locked to the grating feedback to produce the results plotted on FIG. 8. The grating is described in Example 2.

The optical powers from the three "available" output ports, were 57, 58 and 61 mW; 30 mW was transmitted past the fiber grating. This corresponds to an overall excess loss of 1.0 dB for the star coupler/fiber grating configuration. Less than 0.02 dB fluctuation in the power from each of the four output ports occurred while adjusting the polarization controllers on the input ports. Spectral changes were apparent though as the integrated ASE power centered at 968 nm varied from ~12 dB to ~21 dB below the peak power at 975 nm. The broadened mirror reflector significantly enhanced the ASE power for a mirror reflectivity greater than ~10% and at ~25%, equal power was in the 975 nm out and the integrated ASE. It should be possible to design amplifiers, including reflection-amplifiers, to avoid the deleterious effects of a strong broad-band reflector.

What is claimed is:

1. Optical amplifier apparatus comprising
   at least one section of fiber which exhibits gain when excited by an optical pump signal, multiple pump lasers for generating said pump signal as a combination of a plurality of pump signals from said multiple lasers, and a coupler for coupling said pump signals to said at least one gain section, CHARACTERIZED IN THAT said pump lasers have at least partially overlapping resonators, and said at least one gain section is located external to said resonators.

2. The apparatus of claim 1 further characterized in that said coupler is located at least partially within said resonators.

3. The apparatus of claim 1 comprising a plurality of said gain sections located external to said resonators and wherein said pump signal is delivered to each of said sections.

4. The apparatus of claim 2 wherein said sections are arranged in tandem with one another.

5. The apparatus of claim 1 wherein said pump lasers comprise diode lasers.

6. An optical amplifier apparatus comprising at least one section of fiber which exhibits gain when excited by an optical pump signal, multiple pump lasers for generating such pump signal as a combination of a plurality of pump signals from said multiple lasers, and a coupler for coupling said pump signals to said at least one gain section, CHARACTERIZED IN THAT said pump lasers have at least partially overlapping resonators, and said coupler is located at least partially within said resonators.

7. The apparatus of claim 6 comprising a plurality of said gain sections located external to said resonators and wherein said pump signal is delivered to each of said sections.

8. The apparatus of claim 7 wherein said sections are arranged in tandem with one another.

9. The apparatus of claim 6 wherein said pump lasers comprise diode lasers.

\* \* \* \* \*